US005394004A

United States Patent [19]

Jeong

[11] Patent Number: 5,394,004

[45] Date of Patent: Feb. 28, 1995

[54] MULTICOLORED ELECTRIC FIELD LIGHT EMITTING DEVICE WITH PROTRUDED ELECTRODE

[75] Inventor: Jae S. Jeong, Seoul, Rep. of Korea

[73] Assignee: Goldstar Co., Ltd., Seoul, Rep. of Korea

[21] Appl. No.: 71,983

[22] Filed: Jun. 7, 1993

[30] Foreign Application Priority Data

Jun. 9, 1992 [KR] Rep. of Korea ................ 9969/1992

[51] Int. Cl.[6] ..................... H01L 27/14; H01L 31/00; H01L 31/0224; H01L 31/18

[52] U.S. Cl. .................................. 257/431; 257/88; 257/89; 257/93; 257/99

[58] Field of Search ....................... 257/88, 89, 90, 91, 257/92, 93, 99, 431, 432

[56] References Cited

PUBLICATIONS

"Thin Film Electroluminescent Phosphors for Patterned Full-Color Displays" (Springer proceedings in physics, vol. 38) 1989, pp. 132–138.

*Primary Examiner*—Andrew J. James
*Assistant Examiner*—Alice W. Tang

[57] ABSTRACT

A semiconductor device and a method of making the same capable of simplifying the process of making and reducing the cost of making. In the method a first layer is formed which has a plurality of conductors at its edge portion. Thereafter, a second layer is formed on the first layer which is to be selectively etched to form a pattern. During the etching, current is detected from the conductors and the etching is stopped dependent on the current detected from the conductors. The semiconductor device includes a transparent electrode on a substrate the transparent electrode having protrusions which have a top surface. A first insulation layer exists between the protrusions. There is a color emitting layer on the top surfaces of the protrusions and the insulation layer.

7 Claims, 6 Drawing Sheets

MULTICOLORED ELECTRIC FIELD LIGHT EMITTING DEVICE WITH PROTRUDED ELECTRODE

BACKGROUND OF THE INVENTION

The present invention relates to a semiconductor device and a method for manufacturing the same, more particularly to a semiconductor device and a method for manufacturing the same which are capable of exactly executing an etch process.

The etch process is one of essential elements in the manufacturing process of semiconductor device and classified into a dry etch process and a wet etch process.

As well known, the dry etch is a technique which etchs a material with a plasma etchant in chamber having an established atmosphere.

On the other hand, the wet etch is a technique which etchs a material with a solution etchant.

So as to explain the dry etch technique, the manufacturing process of conventional multicolored electric field light emitting device (MEFLED) will hereinafter be described in conjunction with FIG. 1*a* through FIG. 1*e*.

As shown in FIG. 1*a*, first, over a transparent substrate 1 is formed a lower transparent electrode 2 with a thickness of about 2000Å and then a first insulation layer 3 is formed with a thickness of 3000Å on the lower transparent electrode 2.

Subsequently, a first color light emitting layer 4 is formed with a thickness of about 6000Å on the first insulation layer 3 and then a photoresist 5 is uniformly coated on the first color light emitting layer 4.

The photoresist 5 is subjected to a selective etch process to form a desired photoresist pattern 5*a*. It is conventionally called a patterning process that a photoresist pattern 5*a* is made as above mentioned and then a material is selectively etched using the photoresist pattern as an etch mask.

As shown in FIG. 1*b*, thereafter, the first color light emitting layer 4 is etched with a reactive ion etch (RIE) method which is a type of the dry etch technique using the photoresist pattern 5*a* as an etch mask, thereby to form a plurality of first color light emitting layer patterns spaced with an constant interval from each other.

At this time, the surface of the first insulation layer 3 is exposed at portions in which the first color light emitting layer 4 is removed.

As shown in FIG. 1(*c*), a second color light emitting layer 6 is formed with a thickness of about 6000Å on the exposed surfaces of the first insulation layer 3, the photoresist pattern 5*a* and the first color light emitting layer pattern 4*a*.

As shown in FIG. 1(*d*), subsequently, the second color light emitting layer 6 and the photoresist pattern 5*a* are subjected to a RIE method using the surface of the first color light emitting layer pattern 4*a* as an etch-ending point, thereby to form a plurality of second color light emitting layer patterns (6*a*) between the plurality of first color light emitting layer patterns 4*a*.

As shown in FIG. 1*e*, thereafter, a second insulation layer 7 and a conductor are formed on the surfaces of the first color light emitting layer patters 4*a* and the second color light emitting layer patterns 6*a*, in this order.

The conductor is then patterned to form a upper electrode having a desired pattern.

Now, the operation of MEFLED shown in FIG. 1*e* will briefly be described.

The operation of MEFLED is almost similar to that of single colored electric field light emitting device(SEFLED).

As a proper alternating current(AC) voltage is applied to between the lower transparent electrode 2 and the upper electrode 8, electrons are generated at the boundaries between the insulation layers 3, 7 and light emitting patterns 4*a*,5*a*.

At this time, the generated electrons are accelerated due to a high electric field which is formed in the light emitting layer patterns 4*a*,5*a* serving as a conduction band, thereby becoming hot electrons.

The hot electrons strike lattices in the light emitting layer patterns, thereby ionizing the lattices.

As a result, pairs of electron-hole are generated.

At this time, if the electrons exited to the conduction band are again dropped to a valance band, there is emitted a light which has a wave length corresponding to the energy difference.

Conventionally, a red-colored light conventionally has a wave length of about 6500Å and a green-colored light has a wave length of about 5420Å.

However, the above MEFLED has a following problem upon the manufacturing process thereof.

When the first color light emitting layer 4 is dry-etched by the RIE method so as to form the plurality of first color light emitting layer patterns 4*a*, an ending point for stopping the dry-etching is not exactly detected, thereby causing the surface of first insulation layer 3 which is formed below the first color light emitting layer 4 to unnecessarily be etched.

Therefore, it is impossible to manufacture a reliable MEFLED since the surface of first insulation layer 3 is formed in irregularity.

So as to solve the above problem, the above-mentioned conventional art uses an expensive dry etch apparatus capable of exactly dry-etching to a predetermined ending point or uses an insulation material having an etch selectivity higher than that of first color light emitting layer 4, as the material of first insulation layer 3.

An insulation material having an etching speed slower than that of first color light emitting layer 4 should be used, as the material of first insulation layer 3.

As shown in table 1, that is, there is merely used an insulator such as ZnS in which the etch speed is relatively slow and the etch selectivity is relatively high should be used, as the material of first insulation layer 3.

Conventionally, the process for manufacturing a semiconductor device accompanies different etch processes several times.

Accordingly, an corresponding expensive etch apparatus is used every the execution of each etching process, thereby causing the manufacturing cost to be increased.

As above mentioned, there are disadvantages, in that the conventional art for manufacturing a MEFLED should limitedly use the material of insulation layer and also use an expensive etching apparatus in which an ending point detector is equipped therein.

TABLE 1

| | | Etch Selectivity | |
|---|---|---|---|
| Material | Etch Rate | ZnS etch | SrS etch |
| ZnS(Mn,Sm or Tb) | 300 | 1:1 | 0.2:1 |
| SrS:Ce | 67 | 4.5:1 | 1:1 |

TABLE 1-continued

| Material | Etch Rate | Etch Selectivity | |
|---|---|---|---|
| | | ZnS etch | SrS etch |
| SiON | 320 | 0.9:1 | 0.2:1 |
| $Ta_2O_5$ | 280 | 1.5:1 | 0.3:1 |
| $BaTa_2O_5$ | 23 | 13:1 | 3:1 |

SUMMARY OF THE INVENTION

Therefore, an object of the invention is to provide a semiconductor device which is capable of etching a material to an exact ending point without using an expensive etching apparatus having an ending point detector and a method of making the same.

Another object of the invention is to provide a semiconductor device capable of etching, irrespective of the etch selectivity of another material located beneath, a material to be etched and a method of making the same.

In one aspect, the present invention provides a method of making a semiconductor device comprising the steps of: forming a first layer having a plurality of conductors at its edge portion; forming a second layer to be selectively etched for the formation of a pattern on the first layer including the plurality of conductors; selectively etching the second layer and detecting a current from the plurality of conductors during the execution of etching process; and stopping the etching process in accordance with the current detected form the plurality of conductors.

In another aspect, the present invention also provides a semiconductor device comprising: a transparent substrate; a transparent electrode formed with a plurality of protrusions at its edge portion on the surface of the transparent substrate;

a first insulation layer formed on the transparent electrode corresponding to between the protrusions;

a plurality of first color light emitting layers formed with a constant interval on the surfaces of the protrusions and the first insulation layer;

a plurality of second color light emitting layers formed between the plurality of first color light emitting layers;

a second insulation layer formed on the first color light emitting layers and the second color light emitting layers; and an electrode formed on the second insulation layer with a desired pattern.

In another aspect, the present invention provides a method of making a semiconductor device the steps of: preparing a transparent substrate;

forming a lower transparent electrode having a plurality of protrusions at its edge portions, on the transparent substrate;

forming a first insulation layer having a thickness same as the height of protrusions on the lower transparent electrode between the plurality of protrusions, forming a first color light emitting layer on the protrusions and the first insulation layer and then patterning the first color light emitting layer, thereby to form a plurality of first color light emitting layer patterns spaced from each other with a constant interval;

forming a second color light emitting layer on the exposed first insulation layer and the first color light emitting layer patterns and then patterning the second color light emitting layer, thereby to form a plurality of second color light emitting layer patters between the plurality of first color light emitting layer patterns;

forming a second insulation layer on the surfaces of the first color light emitting layer patterns and the second color light emitting layer patterns; and forming an upper electrode with a desired pattern on the second insulation layer.

BRIEF DESCRIPTION OF THE DRAWINGS

Other objects and aspects of the invention will become apparent form the following description of embodiments with reference of the accompanying drawings in which.

DETAILED DESCRIPTION OF THE PREFERRED EMBODIMENTS

Hereinafter, the present invention will be described in detail in conjunction with FIG. 2(*a*) to FIG. 4.

EMBODIMENT I

Referring to FIG. 2*a* to 2*d*, there is illustrated a dry etch process which is essentially used in a process of making a semiconductor device in accordance with a first embodiment of the present invention.

Figure 1A:
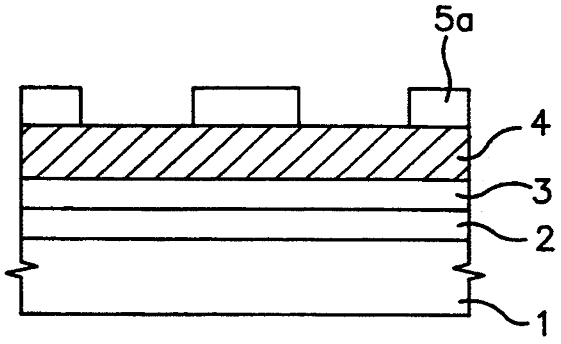
FIG.1a prior art
FIGS. 1*a* to 1*e* are sectional views showing a method of making a conventional MEFLED.
Figure 1B:
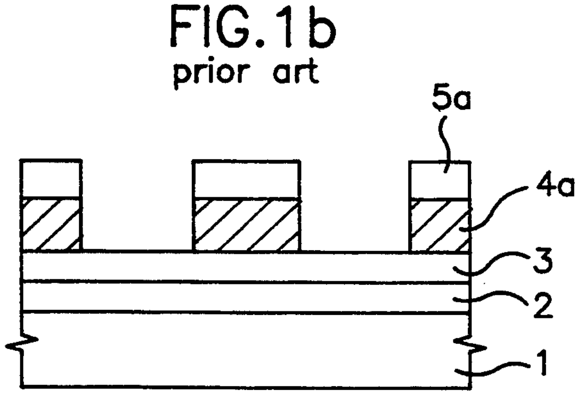
FIG.1b prior art
Figure 1C:
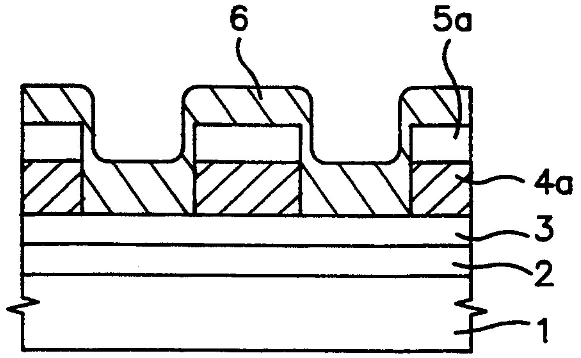
FIG.1c prior art
Figure 1D:
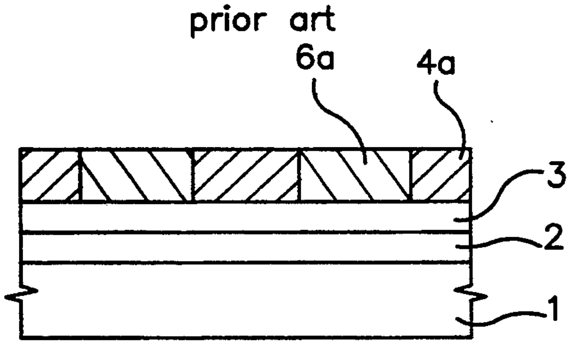
FIG. 1d prior art
Figure 1E:
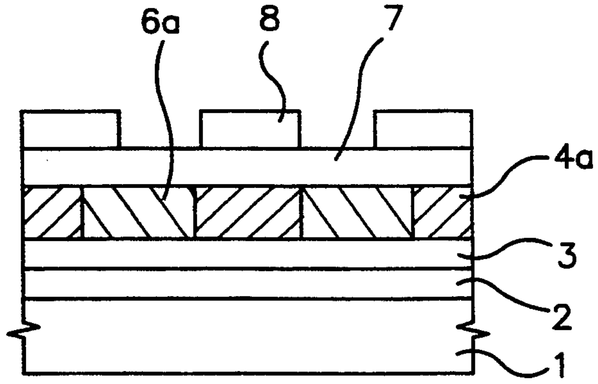
FIG. 1e prior art
Figure 2A:
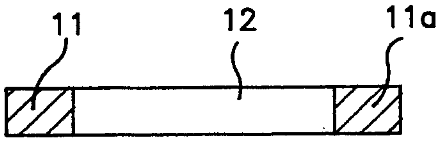
FIGS. 2*a* to 2*d* are sectional views showing a dry etching process in accordance with a first embodiment of the present invention.

First, there is prepared a first layer 12 which has conductors 11, 11*a* at its both edges, respectively, as shown in FIG. 2*a*.

Figure 2B:
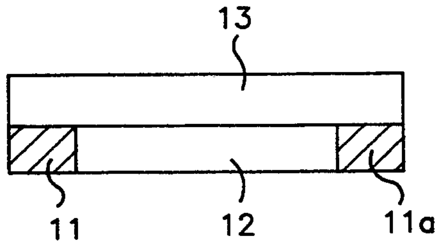

Thereafter, on the first layer 12 is formed a second layer 13 to be selectively etched so as to form a desired pattern as shown in FIG. 2*b*.

Figure 2C:
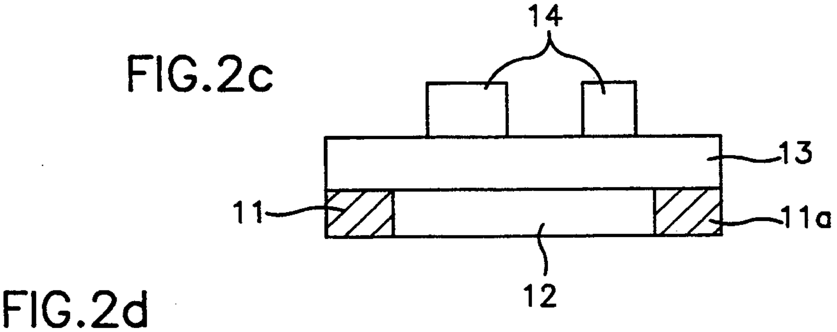

As shown in FIG. 2*c*, a photoresist pattern 14 corresponding to the desired pattern of the second layer 13 is formed on the second layer 13.

Figure 2D:
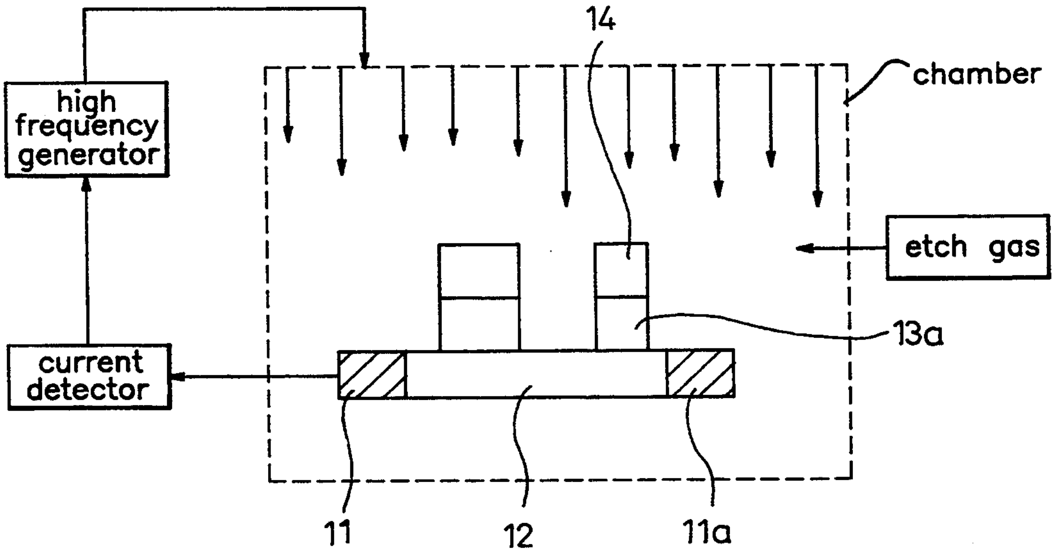

Subsequently, the second layer 13 is subjected to a dry etching process using the photoresist pattern 14 as an etch mask, thereby to form a second layer pattern 13*a*, as shown in FIG. 2*d*.

As shown in FIG. 2*d*, that is, if a high frequency signal from a high frequency generator and an etch are supplied to a chamber for etching, the etching gas becomes a plasma condition by the high frequency signal.

The plasma dry-etches merely a portion of the second layer 13 which is not covered with the photoresist pattern 14.

If the dry etching is performed by the thickness of the second layer 13 and thus the surfaces of the conductors 11, 11*a* are exposed, the plasma collides with the conductors 11, 11*a*.

At this time, a curet is generated from the conductors 11, 11*a* and the current is detected by a current detector, thereby to stop the dry etching.

According to the first embodiment of the present invention, as above mentioned, the etch-ending point of material can be exactly detected although there is not used an expensive dry-etching apparatus which can exactly detect the etch-ending point.

Accordingly, it is possible to exactly etch a layer by a predetermined thickness without damaging another layer which is located beneath the layer to be etched.

As above mentioned, the first embodiment can be merely applied to the dry etching method.

EMBODIMENT II

The dry etching method of the first embodiment can be advantageously applied to processes of making all kinds of semiconductor devices, and more particularly to a process of making an electric field light emitting device (that is, EL device).

A second embodiment is to apply the dry etching method according to he first embodiment to a method of making a MEFLED.

Referring to FIG. 3*a* to 3*f*, there is illustrated a method of making a MEFLED in accordance with the second embodiment of the present invention.

Figure 3A:
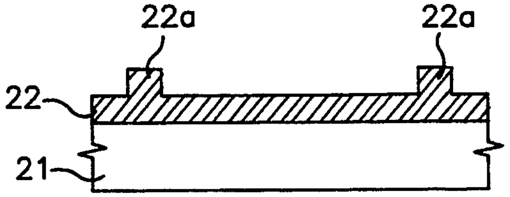
FIGS. 3*a* to 3*f* are sectional views showing a method of making a MEFLED in accordance with a second embodiment of the present invention.

As shown in FIG. 3*a*, first, a transparent conductor is deposited with a thickness of about 5000Å.

The transparent conductor is patterned using a photolightography process and an etching process, to form a lower transparent electrode 22 which has a plurality of protrusions 22*a* having a height of about 3000Å at its edge portion.

Figure 3B:
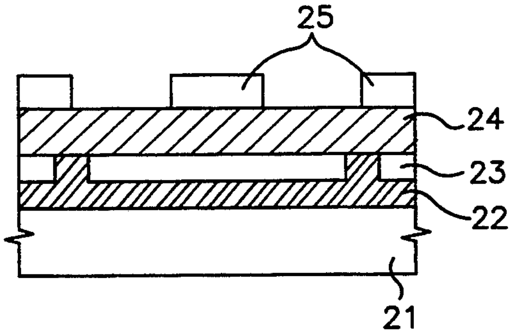

As shown in FIG. 3*b*, subsequently, a first insulation layer 23 is formed between the plurality of protrusions 22*a* so that it has a thickness same as the height of the protrusions 22*a*.

At this time, the thickness of first insulation will be about 3000Å since the height of the protrusions in about 3000Å.

Over the surfaces of the protrusions 22*a* and the first insulation layer 23 is formed a first color light emitting layer 24 which has a thickness of about 6000Å and will be selectively etched to form a desired pattern.

Thereafter, on the surface of the first color light emitting layer 24 is formed a photoresist pattern 25 which is corresponding to the desired pattern of the first color light emitting layer 24.

Herein, a glass substrate may be used as the material of transparent substrate 21.

Indium thin oxide(ITO) may be used as the material of transparent electrode 22.

Irrespective of etching selectivity, one of insulation materials such as SiON, $Si_3N_4$, $Y_2O_3$, $Ta_2O_5$ and $BaTa_2O_5$ may be used as the material of first insulation 23.

Also, the first color light emitting layer 24 is made of ZnS: Sm which emits a recolored light.

Figure 3C:
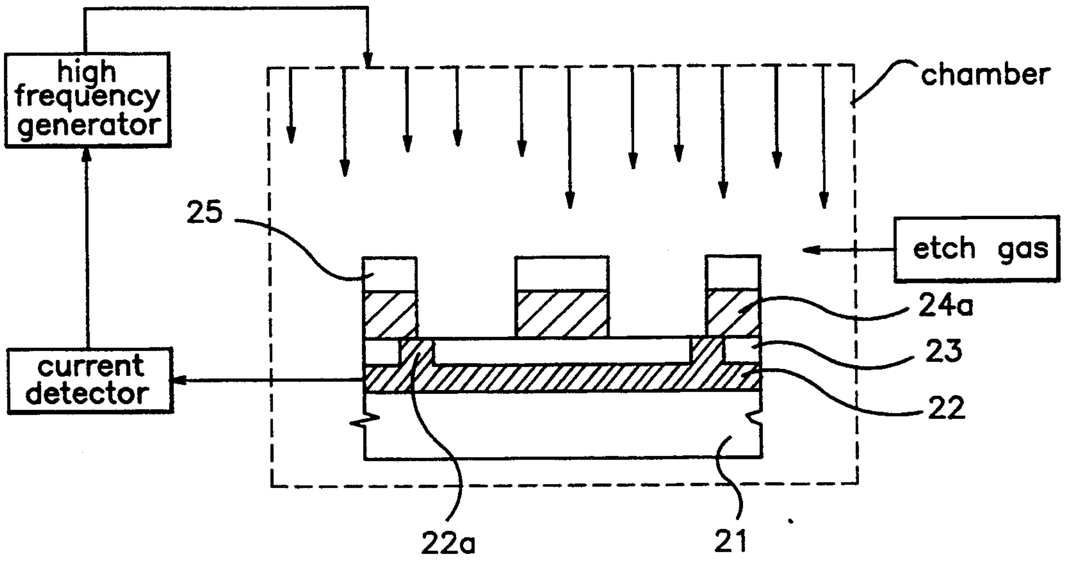

Thereafter,the first color light emitting layer 24 is selectively dry-etched in a chamber using the photoresist pattern 25 as an etching mask, as shown in FIG. 3*c*.

At this time, a reactive ion etching (RIE) method is used as a dry-etching method and $Bcl_3+Cl_2$ is used as an etching gas.

The dry-etching process is as follows.

First, a high frequency signal from a high frequency generator and $Bcl_3+Cl_2$ gas served as an etching gas are supplied to the chamber. At this time, $Bcl_3+Cl_2$ gas becomes a plasma condition and the plasma selectively etches the first color light emitting layer, thereby to form a plurality of first color light emitting layer patterns 24*a* spaced form each other with a constant interval.

At this time, if the plasma all etches a portion which is not covered with the photoresist pattern 25 and thus the protrusions 22*a* of the lower transparent electrode 22 is exposed, the plasma collides with the protrusions 22*a* which is a conductor, thereby causing a current at the protrusions 22*a* to be generated.

A current detector outputs a signal for stopping the driving of high frequency generator to the high frequency generator, thereby to stop the RIE process.

Figure 3D:
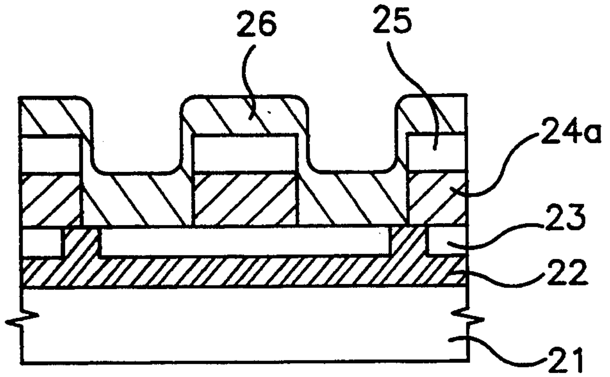

Subsequently, over the exposed whole surfaces of protrusions 22*a*, first insulation layer 23, photoresist pattern 25 and first color light emitting patterns 24*a* is deposited a second color light emitting patterns 24*a* which has a thickness of about 6000Å, as shown in FIG. 3*d*.

Figure 3E:
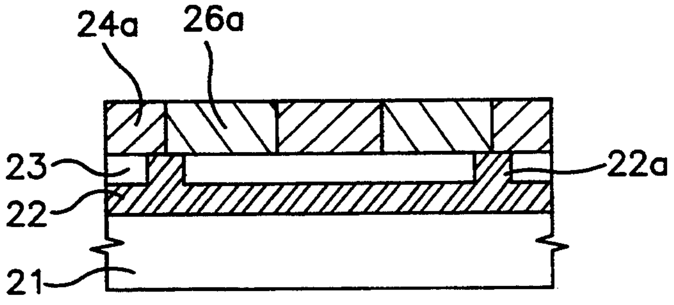
Figure 3F:
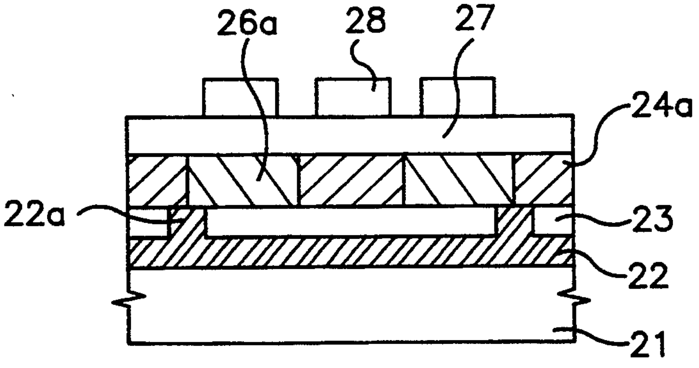

As shown in FIG. 3*e*, the second color light emitting layer 26 and the photoresist pattern 25 formed on the surface of the plurality of first color light emitting layer patterns(24*a* ) are removed with a lift-off process, thereby to form a plurality of second color light emitting layer patterns 26*a*.

According to FIG. 3*e*, the first color light emitting layer patterns 24*a* and the second color light emitting layer patterns 26*a* are alternately formed.

Subsequently, a second insulation layer 27 and a conductor are formed on the first color light emitting layer patterns 24*a* and the second color light emitting layer patterns 26*a*, in this order.

The conductor is subjected to a patterning process, thereby to form an upper electrode 28 having a desired pattern.

Herein, ZnS: Tb which emits a green light is used as the material of second color light emitting layer 26.

An insulation material may be used the material of second insulation layer 27 irrespective of etch selectivity.

Figure 4:
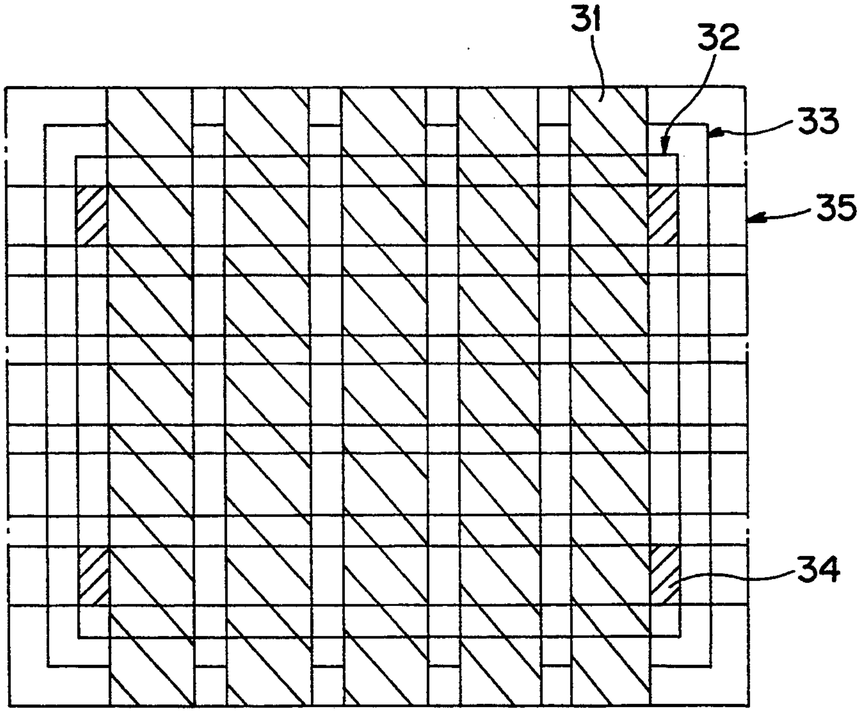
FIG. 4 is a plane view of a MEFLED which is manufactured by FIG. 3*a* to 3*f*.

Referring to FIG. 4, there is illustrated a view showing a plan of MEFLED which is manufactured by FIG. 3*a* to FIG. 3*f*.

In FIG. 4, the reference numeral 31 denotes the upper electrode 28, the reference numeral 32 denotes the first color light emitting layer pattern 24*a* and the second color light emitting layer patterns 26*a* of FIG. 3, the reference number 33 denotes the first insulation layer 23 and the second insulation layer 27, the reference numeral 34 denotes the protrusions 22*a*, as illustrated in FIG. 3(*a*) and the reference numeral 35 denotes the transparent electrode which is transparent electrode 22, as illustrated in FIG. 3(*a*).

According to the second embodiment of the present invention, as above mentioned, a first color light emitting layer 24 is subjected to a RIE method which is a kind of dry etching method, to form the plurality of first color light emitting layer patterns 24*a*. At this time, $Bcl_3+Cl_2$ gas becomes the plasma condition by high frequency signals from the high frequency generator.

When $Bcl_3+Cl_2$ being the plasma condition is reached to the boundary between the first insulation layer 23 and the first color light emitting layer 24, ions of $Blc_3+Cl_2$ gas being the plasma condition are contacted with the protrusions 22*a*. At this time, a low current is generated in the protrusions 22*a* and the current detector outputs the control signal for stopping the driving of high frequency generator which makes $Bcl_3+Cl_2$ gas into the plasma condition, thereby stopping the RIE process.

The following effects can be achieved in accordance with the second embodiment.

First, any insulation materials may be used as the material of first insulation layer, irrespective of the etch selectivity thereof.

Second, it is not required that a etch stop layer should be used or an expensive etch apparatus equipped with an etch ending point detector should be used, so as to exactly stop an etching process.

It is therefore possible to shorten the manufacturing process of MEFLED and also reduce the manufacturing cost of MEFLED.

What is claimed is:

1. A semiconductor device comprising:

(a) a transparent substrate;

(b) a lower transparent electrode which has a plurality of protrusions at its edge portion each protrusion having a top surface;

(c) a first insulation layer on the lower transparent electrode between the protrusions;

(d) a plurality of first color light emitting layer which are formed on the top surfaces of the protrusions and the first insulation layer and spaced from each other with a constant interval;

(e) a plurality of second light emitting layer formed between the plurality of first color light emitting layers;

(f) a second insulation layer formed on the first color light emitting layers and the second color light emitting layers; and (g) an upper electrode formed with a pattern on the second insulation.

2. A semiconductor device in accordance with claim 1, wherein the transparent substrate is made of glass.

3. A semiconductor device in accordance with claim 1, wherein the lower transparent electrode is made of indium thin oxide.

4. A semiconductor device in accordance with claim 1, wherein the first insulation layer and the second insulation layer is made of one of SiON, $Si_3N_4$, $Y_2O_3$ and $Ta_2O_5$.

5. A semiconductor device in accordance with claim 1, wherein the plurality of first color light emitting layers are made of ZnS: Sm which emits a red light.

6. A semiconductor device in accordance with claim 1, wherein the plurality of second color light emitting layers are made of ZnS:Tb which emitts a green light.

7. A semiconductor device in accordance with claim 1, wherein the protrusions have a height and the first insulation layer has a thickness with the height of protrusions being the same as the thickness of first insulation layer.

* * * * *